(12) United States Patent
Toshikiyo

(10) Patent No.: US 7,851,837 B2
(45) Date of Patent: Dec. 14, 2010

(54) LIGHT-COLLECTING DEVICE AND SOLID-STATE IMAGING APPARATUS

(75) Inventor: Kimiaki Toshikiyo, Osaka (JP)

(73) Assignee: Panasonic Corporation, Osaka (JP)

( * ) Notice: Subject to any disclaimer, the term of this patent is extended or adjusted under 35 U.S.C. 154(b) by 1148 days.

(21) Appl. No.: 10/576,273

(22) PCT Filed: Dec. 15, 2004

(86) PCT No.: PCT/JP2004/018750

§ 371 (c)(1),
(2), (4) Date: Apr. 18, 2006

(87) PCT Pub. No.: WO2005/059607

PCT Pub. Date: Jun. 30, 2005

(65) Prior Publication Data

US 2007/0164329 A1    Jul. 19, 2007

(30) Foreign Application Priority Data

Dec. 18, 2003 (JP) .............................. 2003-421111

(51) Int. Cl.
*H01L 31/113* (2006.01)
(52) U.S. Cl. ............... 257/291; 257/432; 257/E31.127
(58) Field of Classification Search ............... 257/291, 257/292, 184–189, 225–234, 432
See application file for complete search history.

(56) References Cited

U.S. PATENT DOCUMENTS

| 4,994,664 A | 2/1991 | Veldkamp | |
| 2003/0071271 A1* | 4/2003 | Suzuki et al. | .................. 257/98 |
| 2003/0168679 A1 | 9/2003 | Nakai et al. | |
| 2003/0215967 A1* | 11/2003 | Shizukuishi | .................. 438/22 |

(Continued)

FOREIGN PATENT DOCUMENTS

JP    4-343471    11/1992

(Continued)

OTHER PUBLICATIONS

English Language Abstract of JP 2000-039503.

(Continued)

*Primary Examiner*—Sue Purvis
*Assistant Examiner*—Selim Ahmed
(74) *Attorney, Agent, or Firm*—Greenblum & Bernstein P.L.C.

(57) ABSTRACT

A solid-state imaging apparatus includes unit pixels arranged in a two-dimensional array. Each unit pixel includes a light-collector and light-receiver. The light-collector includes light-transmitting films that form a refractive index distribution and multiple zones, each of which has a width equal to or shorter than a wavelength of incident light. For each central unit pixel, a center axis of the light-receiver matches a central axis of the light-collector. For each peripheral unit pixel, a central axis of the light-collector is displaced from the central axis of the light-receiver toward the center of the imaging area. The line width of each light-transmitting film of a central unit pixel is different than the line width of each light-transmitting film of a peripheral unit pixel in a same relative position, and the sum of line widths of the central unit pixel differs from the sum of line widths of the peripheral unit pixel.

5 Claims, 10 Drawing Sheets

U.S. PATENT DOCUMENTS

| | | | |
|---|---|---|---|
| 2004/0000681 A1* | 1/2004 | Shinohara et al. | 257/290 |
| 2004/0005482 A1 | 1/2004 | Kobayashi et al. | |
| 2004/0126934 A1* | 7/2004 | Itano et al. | 438/129 |
| 2005/0061950 A1* | 3/2005 | Jiang et al. | 250/208.1 |
| 2006/0102827 A1 | 5/2006 | Kasuga et al. | |

FOREIGN PATENT DOCUMENTS

| | | |
|---|---|---|
| JP | 5-251673 | 9/1993 |
| JP | 9-251943 | 9/1997 |
| JP | 2000-039503 | 2/2000 |
| JP | 2001-108812 | 4/2001 |
| JP | 2001108812 * | 4/2001 |
| JP | 2001-318217 | 11/2001 |
| JP | 2002-135796 | 5/2002 |
| JP | 2003-066229 | 3/2003 |
| JP | 2003-215309 | 7/2003 |
| JP | 2003-229553 | 8/2003 |

OTHER PUBLICATIONS

English Language Abstract of JP 5-251673.

D. W. Prather, "Design and application of subwavelength diffractive lenses for integration with infrared photodetectors," Opt. Eng. 38(5), pp. 870-878 (May 1999; Society of Photo-Optical Instrumentation Engineers).

U.S. Patent Appl. No. 10/576,023.

English Language Abstract of JP 2001-108812.

English Language Abstract of JP 2001-318217.

English Language Abstract of JP 2003-229553.

English Language Abstract of JP 2002-135796.

English Language Abstract of JP 4-343471.

English language translation of Paragraph No. [0036], [0047] and Figs. 1c, 2c, 3c, 7 of JP 2001-108812, which published on Apr. 20, 2001.

English language translation of Paragraph No. [0013] of JP 2003-066229, which published on Mar. 5, 2003.

English language translation of Paragraph No. [0031]—[0033] of JP 9-251943, which published on Sep. 22, 1997.

* cited by examiner

Prior Art  FIG. 1
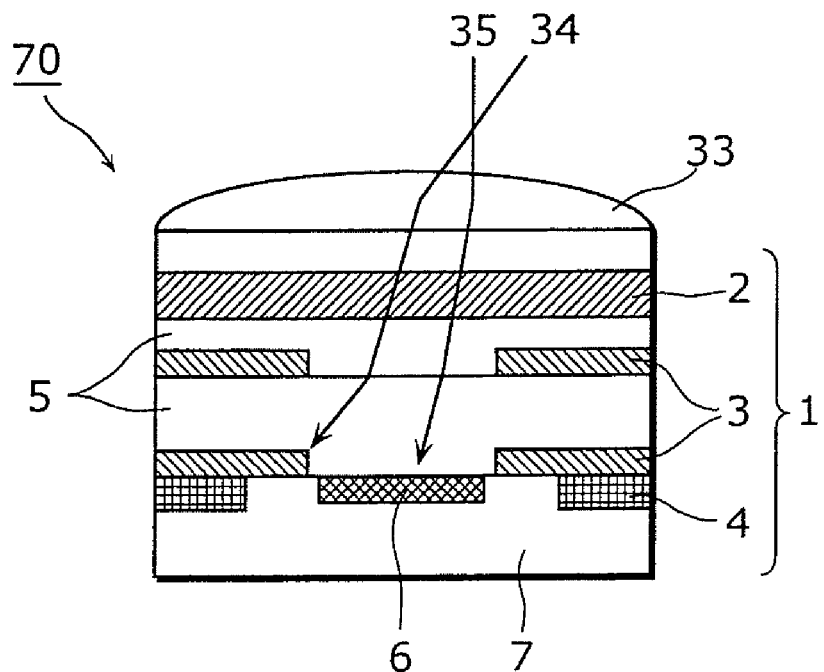
Prior Art  FIG. 2
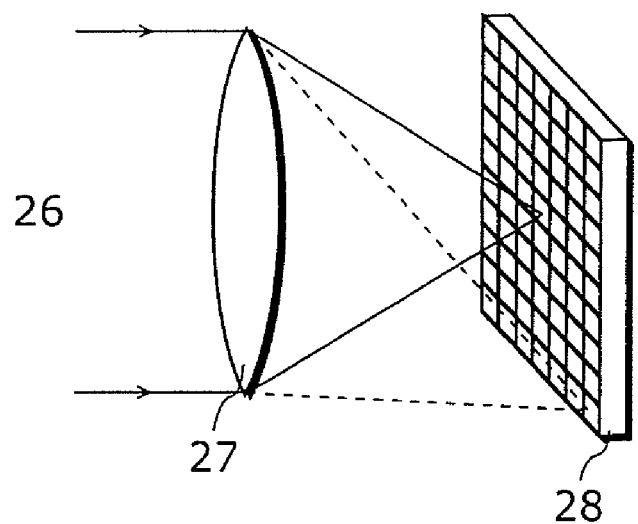

Prior Art  FIG. 3
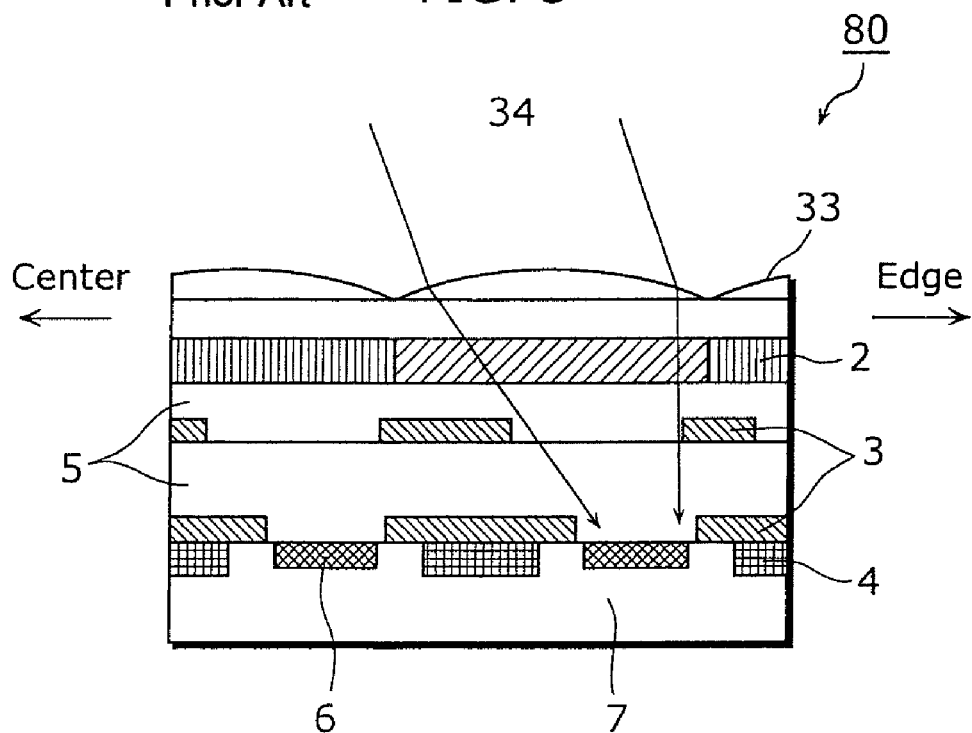
FIG. 4
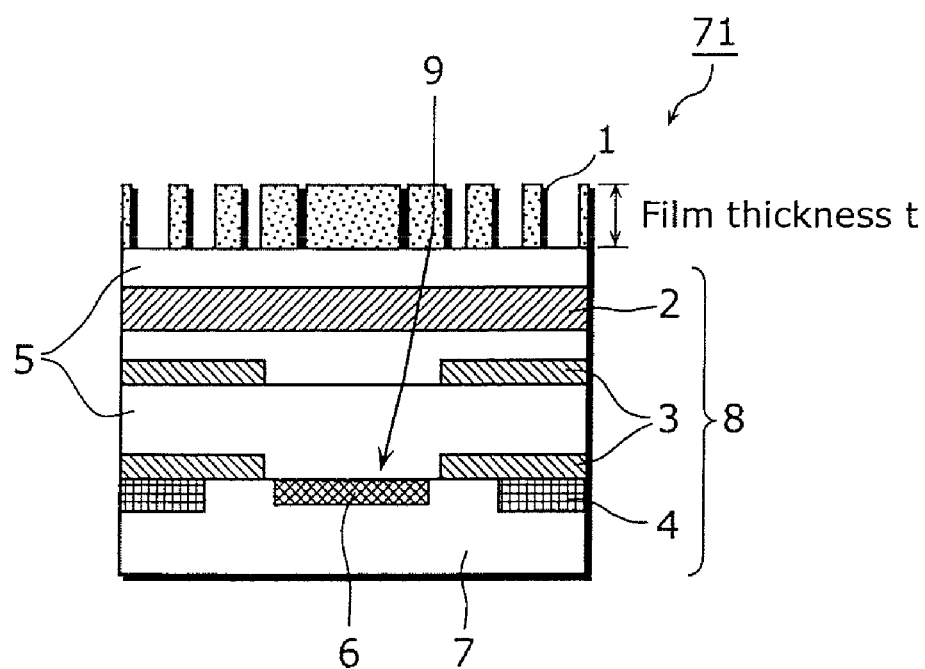

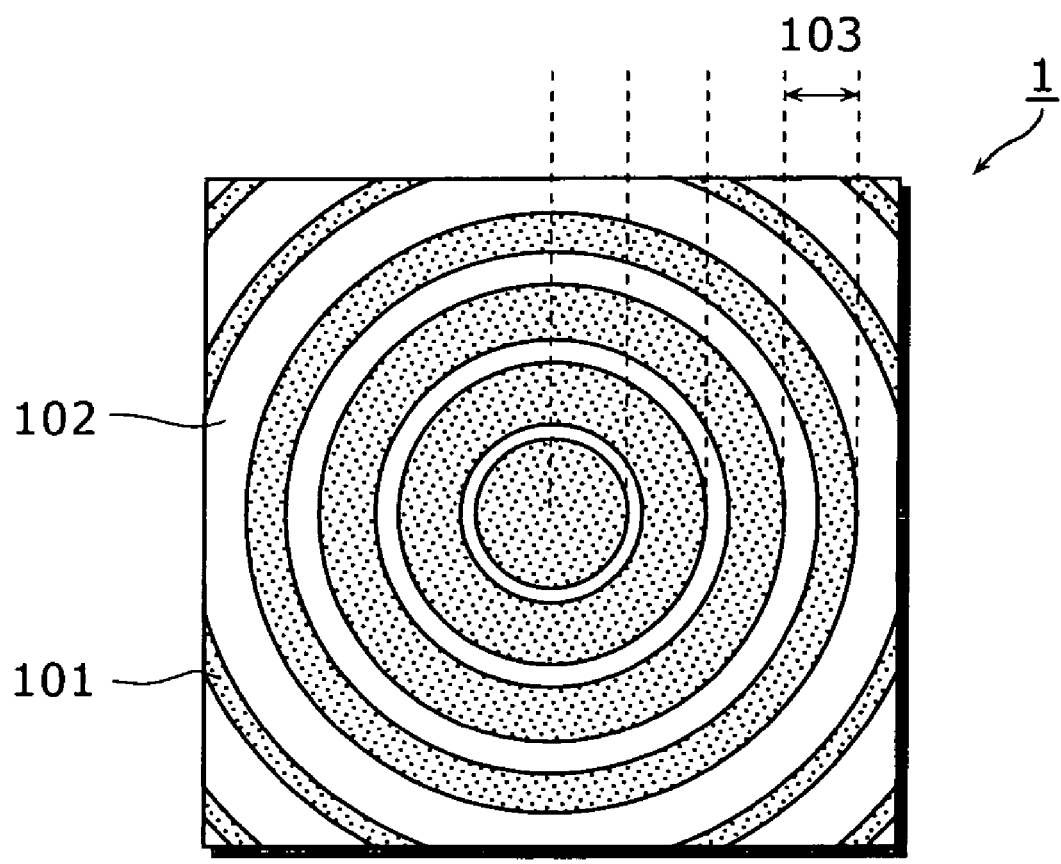

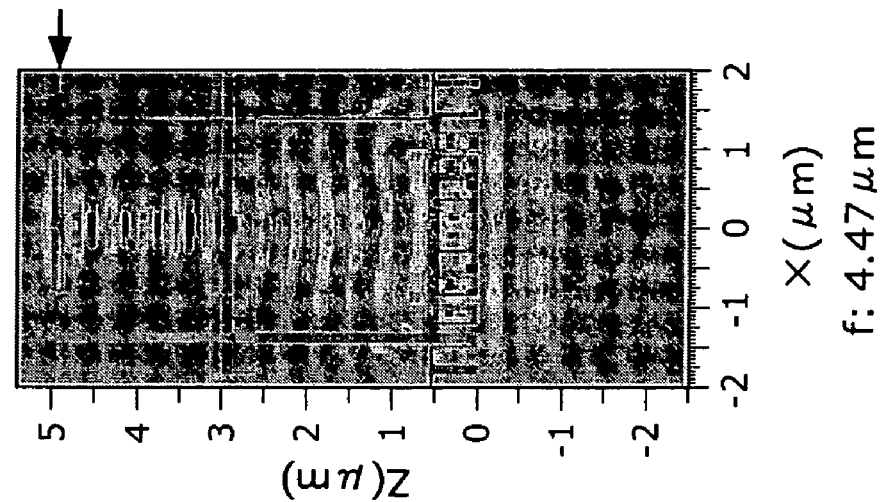
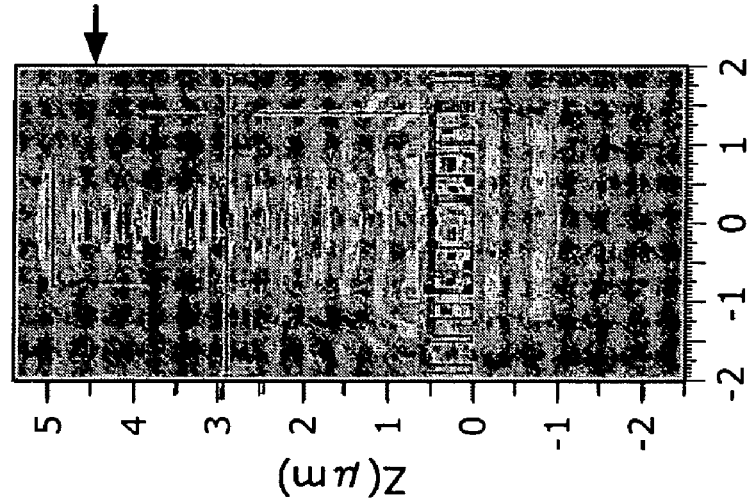
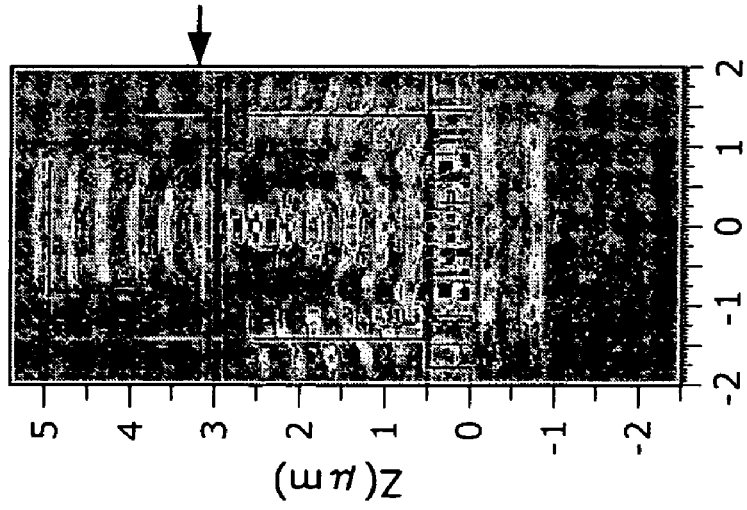

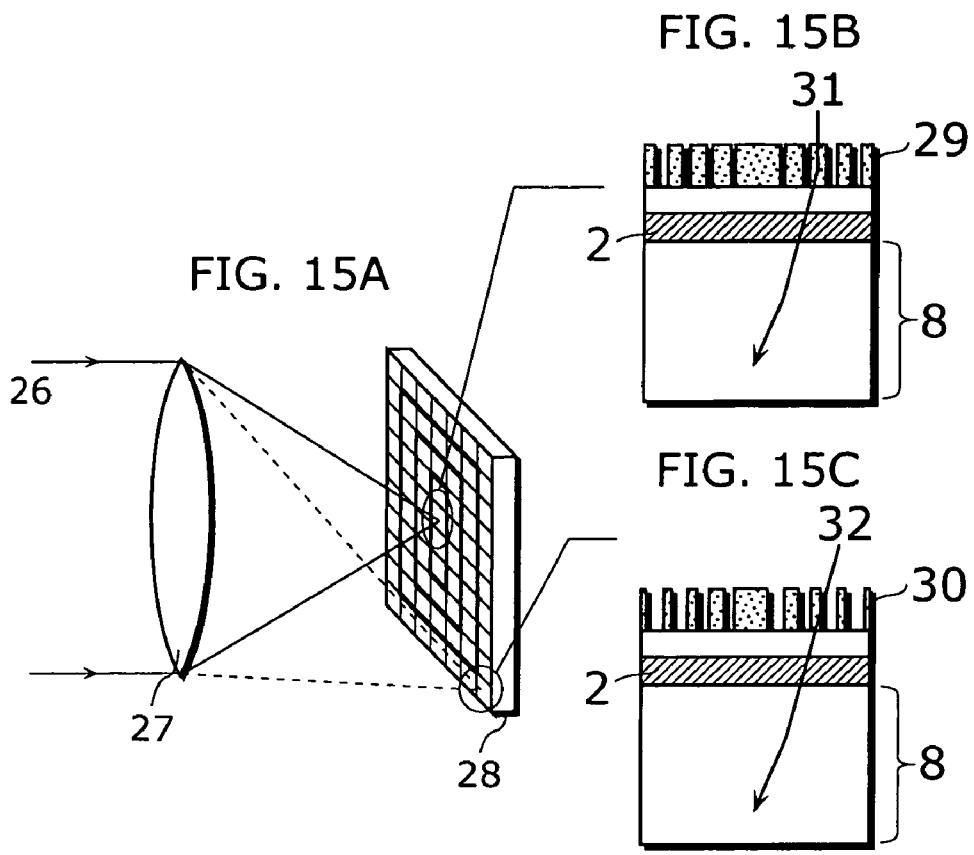
FIG. 15A
FIG. 15B
FIG. 15C
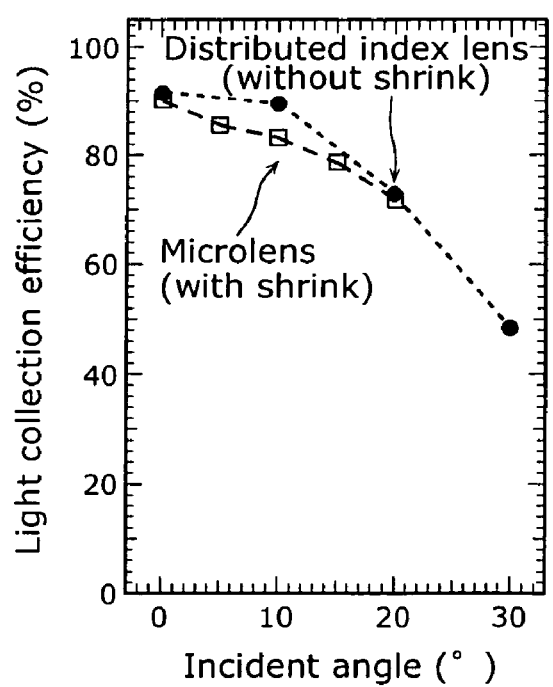
FIG. 16

LIGHT-COLLECTING DEVICE AND SOLID-STATE IMAGING APPARATUS

TECHNICAL FIELD

The present invention relates to a light-collecting device and a solid-state imaging apparatus that are used in a digital camera and the like.

BACKGROUND ART

Along with the widespread use of a digital camera, a camera-equipped cell phone and the like, the market of the solid-state imaging apparatus has been remarkably developed. In this flow of development, it is expected that the development of a high resolution and high sensitivity of the solid-state imaging apparatus is accelerated.

In the present, in a charged-coupled device (CCD) and a metal oxide semiconductor (MOS) imaging sensor that are commonly used as solid-state imaging apparatuses, semiconductor integrated circuits having multiple light-receiving portions are arranged in a two-dimensional array, in which a light signal from an object is converted into an electric signal.

The sensitivity of the solid-state imaging apparatus is defined based on an amount of output current of a light-receiving device to the amount of incident light so that leading the incident light certainly into the light-receiving device is an important factor for the improvement of sensitivity.

FIG. 1 shows an example of a conventional structure of a general pixel. A solid-state imaging apparatus (unit pixel for blue light) 70 includes a microlens 33 which collects incident light, a color filter 2 which separates and transmits blue (B) light from the incident light, a light-receiving device (Si photodiode) 6 which converts the incident light into charge, an electric signal transmitting unit 4 for transmitting the charge, Al wirings 3, planarized layers 5 and a Si substrate 7. The solid-state imaging apparatuses for read light (R) and green light (G) have the same structure except the fact that the color filter 2 only differs. Relatively high light-collection efficiency can be obtained by such structure. Therefore, the microlens 33 is used in almost all solid-state imaging apparatuses. Whereas various technologies are disclosed as a solid-state imaging apparatus using a Fresnel lens (e.g. refer to First Patent Reference and Second Patent Reference).

In the technology disclosed in the First Patent Reference, the lens is made up of multiple layers that are concentrically formed, each of which has a unique refractive index. The center part of the concentric circle structure has the highest refractive index as the refractive index decreases toward the direction of the peripheral part. Also, in the technology disclosed in the Second Patent Reference, a thickness distribution type lens and a distribution refractive index type lens which has a consecutive refractive index distribution by doping are used.

Patent Reference 1: Japanese Laid-Open Patent Publication No. 2000-39503

Patent Reference 2: Japanese Laid-Open Patent Publication No. 5-251673

DISCLOSURE OF INVENTION

Problems that Invention is to Solve

Hereafter, in order to achieve higher resolution and sensitivity of the solid-state imaging apparatus, it is necessary to reduce the size of a pixel without declining the light-collection efficiency. However, the microlens has a very fine structure in micrometer order and self-organizationally formed through reflow. Therefore, when it is tried to reduce the pixel size, it is very difficult to control a formation of a hemisphere.

Further, the microlens has a problem that the light-collection efficiency declines with increases in an angle of incidence of a signal light. That is to say, as shown in FIG. 1, while the light 35 vertically incoming to the microlens 33 can be collected highly efficiently, the light 34 incoming diagonally to the microlens 33 cannot be collected efficiently so that the light-collection efficiency is reduced.

FIG. 2 is a diagram showing a fundamental structure of a conventional pixel arrangement. The incident light 26 is incoming to a solid-state imaging apparatus 28 placed in a focal length through the optical lens 27. The solid-state imaging apparatus 28 is made up of multiple pixels that are arranged in a two dimensional array. Therefore, in the case of incident light with a spread angle, the angle of incidence differs between the central pixels and the peripheral pixels. As the result, the light-collection efficiency of the peripheral pixels declines than in the central pixels.

FIG. 3 shows an example of a conventional structure of a pixel in a periphery. The incident angle of the incident light 34 is greater at pixels at the periphery of a solid-state imaging apparatus 80. Therefore, the improvement of the light-collection efficiency is sought by displacing electric wiring parts such as the light-receiving device 6, the electric signal transmitting unit 4 and the AL wirings 3 to the inner (central) direction, that is, by shrinking. However, the amount of light received at the peripheral pixels is about 40 percent of that of the central pixels so that the sensitivity of total elements is limited to the sensitivity of the peripheral elements. Further, since the value further decreases as the pixel size is reduced, an application for the short focal point optical system such as a miniaturized camera becomes very difficult. Further in a manufacturing process of a solid-state imaging apparatus, it is necessary to adjust positions of the microlens 33, the light-receiving device 6, the electric signal transmitting unit 4 and the Al wirings 3.

Thus, in order to realize high resolution and high picture quality of the solid-state imaging apparatus, an object of the present invention is to provide a light-collecting device which is more resistant to incident light with higher angle than the microlens, and a manufacturing method of the light-collecting device.

Means to Solve the Problems

In order to solve the aforementioned problem, a light-collecting device according to the present invention is a light-collecting device which collects incident light, including: a substrate into which the incident light is incident; and above the substrate, a plurality of light-transmitting films formed in a region into which the incident light is incident, wherein the light-transmitting film forms a zone in which a width of each zone is equal to or shorter than a wavelength of the incident light, and the plurality of the light-transmitting films form an effective refractive index distribution.

Accordingly, a light-collecting device which is more resistant to high-angle incident light than a microlens can be realized.

Also, in the plurality of the light-transmitting films, each light-transmitting film may have a constant line width.

Accordingly, a process of manufacturing the light-collecting device becomes easier so that a high-precision light-collecting device can be manufactured in a low cost.

Further, in one of areas of the light-transmitting films divided by a length equal to or shorter than the wavelength of the incident light, a sum of the line widths of the light-transmitting films is smaller than a sum of the line widths in another one of the areas that is closer to a zone center.

Accordingly, a valid refractive index of a light-transmitting film decreases in a direction from the center toward the periphery so that a distributed index lens with light-collecting characteristics can be realized.

Further, the zone model may be concentric circles.

Also, $\Delta n(r)=\Delta n_{max}[1+m-n_1 r^2/(2\lambda f)]$ is approximately satisfied, where $\lambda$ is the wavelength of the incident light, f is a focal length, $n_0$ is a refractive index of a medium on a light incoming side, $n_1$ is a refractive index of a medium on a light outgoing side, m is a non-negative integer, and a maximum value of a refractive index of said light-transmitting film is $n_0+\Delta n_{max}$, when a difference from the $n_0$ is $\Delta n(r)$.

Further, $W=a(1+m-n_1 r^2/(2rf))$ is satisfied, where $\lambda$ is the wavelength of the incident light, f is a focal length, a is a width of the divided area, $n_1$ is a refractive index of a medium on a light outgoing side, m is a non-negative integer, and $r_m$ is a Fresnel zone boundary, that is a natural number which satisfies $r_m^2=2m\lambda f/n_1$, taking that a sum W of the line widths of said light-transmitting films in one of the divided areas having an inner radius r where r is larger than $r_m$ and smaller than $r_{m+1}$.

Accordingly, a focal length of the incident light with a certain wavelength can be specified only by a shape of the light-transmitting film so that a distributed index lens can be formed by a semiconductor lithography process.

Also, heights of said light-transmitting films are constant in a direction normal to said light-transmitting films.

Accordingly, the film thickness of the light-collecting device is even so that a light-collecting device can be manufactured by the conventional semiconductor planer process. Therefore, the manufacturing costs can be reduced.

Also, a shape of cross sections of the light-transmitting films in a direction normal to the light-transmitting films is rectangular.

Accordingly, a precise refractive index distribution can be realized so that the light-collection efficiency is increased.

Further, each of the light-transmitting films includes one of $TiO_2$, $ZrO_2$, $Nb_2O_5$, $Ta_2O_5$, $Si_3N_4$ and $Si_2N_3$.

The materials are high refractive index light-transmitting materials so that the thickness of the light-transmitting film can be thinned and the manufacturing process can be easier.

Further, each of the light-transmitting films includes one of $SiO_2$ doped with B or P, that is Boro-Phospho Silicated Glass, and Teraethoxy Silane.

The material is a material generally used for the conventional semiconductor process so that a light-collecting device can be easily manufactured and the manufacturing costs can be reduced.

Also, each of the light-transmitting films includes one of benzocyclobutene, polymethymethacrylate, polyamide and polyimide.

The resin including the above can be processed directly so that the manufacturing costs can be reduced.

Further, in order to achieve the above object, the solid-state imaging apparatus according to the present invention is a solid-state imaging apparatus including unit pixels that are arranged in a two-dimensional array, each unit pixel including a respective light-collecting device. The light-collecting devices includes: a substrate into which the incident light is incident; and above the substrate, a plurality of light-transmitting films formed in a region into which the incident light is incident, wherein the light-transmitting film forms a zone in which each zone is equal to or shorter than a wavelength of the incident light, and the plurality of the light-transmitting films form an effective refractive index distribution.

Accordingly, the light-collection efficiency of a unit pixel can be increased without using a microlens. Therefore, a high-resolution and high-sensitive solid-state imaging element can be realized.

Further, the line widths of the light-transmitting films are different between the light-collecting devices of the unit pixels located close to a zone center and the light-collecting devices of the unit pixels located near the zone periphery.

Accordingly, an even light-collection efficiency can be obtained for among all the light-collecting devices arranged in a two dimensional array.

Further, the solid-state imaging apparatus includes at least: a first unit pixel for first color light out of the incident light; and a second unit pixel for second color light which has a typical wavelength that is different from a typical wavelength of the first color light; wherein the first unit pixel includes a first light-collecting device, and the second unit pixel includes a second light-collecting device in which a focal length of the second color light is equal to a focal length of the first color light in said first light-collecting device.

Accordingly, a lens structure of each pixel can be optimized by a wavelength of incident light and the difference of light-collection efficiency depending on colors can be equalized.

Further, sums of the line widths of the light-transmitting films in each of the divided areas are different between a light-collecting device of the unit pixel located in a center of a plane on which the unit pixel is formed and a light-collecting device of the unit pixel located in the periphery of the plane.

Accordingly, the lens structure can be optimized depending on a position of a unit pixel on a solid-state imaging apparatus so that a shrink structure of the solid-state imaging apparatus can be moderated. Further, a method of manufacturing a light-collecting device becomes easier so that an overall sensitivity of the light-collecting device can be increased.

Furthermore, a plane on which the pixels are formed is divided by concentric areas from a center of the plane to the periphery, focal lengths of the light-collecting devices of the unit pixels belonging to a same area are equal, and focal lengths of the light-collecting devices of the unit pixels belonging to areas other than the same area are different.

Accordingly, the incident angle can be changed inside a plane without affecting the easiness of the manufacturing process.

Further, each unit pixel further includes: a wiring layer having an aperture above a light-receiving device, on a light-outgoing side plane of the light-collecting device, and a focal point of light collected by the light-collecting device matches a position of the aperture of the wiring layer.

Accordingly, the best use of a light-receiving plane can be realized so that the light-collection efficiency can be increased.

Furthermore, in the unit pixels located in a center of a plane on which the unit pixels are formed, a central axis of each of the light-receiving devices is placed to match a central axis of each of the light-collecting devices, and in the unit pixels located in the periphery of the center of the plane, a central axis of each of the light-receiving devices and a central axis of each of the light-collecting devices are placed toward the center of the plane.

Accordingly, a low grade shrink structure can be used so that the light-collection efficiency of the peripheral pixels can be further increased.

EFFECTS OF THE INVENTION

In the light-collecting device and solid-state imaging apparatus according to the present invention, a distributed index type light-collecting device which can change valid refractive index by changing a sum of concentric line widths can be realized. Also, a focal length of the incident light of a certain wavelength can be specified only from a shape so that a distributed index lens can be manufactured through a semiconductor lithography process. Further, a sharper change of the refractive index than the conventional lens is caused and the light-collection efficiency is increased.

Further, since the high refractive index materials are used, the thickness of a light-transmitting film can be thinned and the manufacturing process becomes easier.

Furthermore, the light-collection efficiency of a pixel can be increased without using a microlens. Accordingly, a high resolution and high sensitive solid-state imaging apparatus can be realized. Also, the lens structure of each pixel can be optimized according to a wavelength of the incident light so that the difference of the light-collection efficiency among colors can be the same. In addition, the focal length of the incident becomes changeable so that a lens structure appropriate for each pixel structure can be designed. Also, the lens structure of each pixel can be optimized according to the incident angle of the incident light so that the decrease of the light-collection efficiency along with an increase of the incident angle can be stopped. Furthermore, the best use of the light-receiving plane is made and the light-collection efficiency is increased.

A high sensitive one-dimensional or two-dimensional image input device can be realized. Here, the lens structure can be optimized according to a position of a pixel on the solid-state imaging apparatus and the shrink structure of the solid-state imaging apparatus can be moderated. Further, a manufacturing method of a light-collecting device becomes easier and an overall sensitivity of the light-collecting device is increased. Furthermore, the incident angle can be changed in a plane without affecting the easiness of the process. In addition, a low grade shrink structure can be used and the light-collection efficiency of the peripheral pixels is further increased.

BRIEF DESCRIPTION OF DRAWINGS

FIG. 1 is a cross-section diagram showing a fundamental structure of a conventional solid-state imaging apparatus.

FIG. 2 is a diagram showing a fundamental structure of a conventional pixel arrangement.

FIG. 3 is a diagram showing a fundamental structure of a conventional pixel.

FIG. 4 is a diagram showing a fundamental structure of a unit pixel according to the first embodiment of the present invention.

FIG. 5 is a diagram showing a structure of a top surface of a distributed index lens according to the first embodiment of the present invention.

FIGS. 12A to 12C are diagrams, each of which shows a light collectivity (simulation result) of the distributed index lens according to the third embodiment of the present invention.

FIGS. 15A to 15C are diagrams, each of which shows a fundamental structure of a solid-state imaging apparatus according to the fifth embodiment of the present invention.

FIG. 16 is a diagram showing a light-collectivity of the distributed index lens according to the fifth embodiment of the present invention.

Figure 6A:
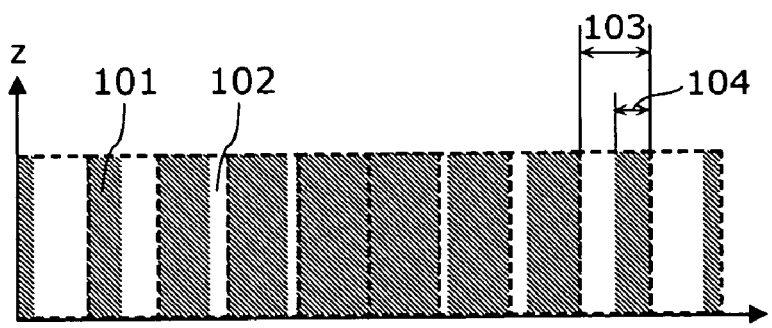
FIGS. 6A to 6E are diagrams, each of which shows a structure of a cross-section of the distributed index lens according to the first embodiment of the present invention.

NUMERICAL REFERENCES 1, 1a, 1b distributed index lens
2 color filter
3 Al wiring
4 signal transmitting unit
5 planarized layer
6 light-receiving device (Si photodiode)
7 Si substrate
8 semiconductor integrated circuit
9, 26 incident light
13 color filter for B light
14 color filter for G light
15 color filter for R light
16 refractive index distribution of B light lens
17 refractive index distribution of G light
18 refractive index distribution of R light
19 focal length
20 refractive index distribution on short focal point lens
21 refractive index distribution on middle-range focal point lens
22 refractive index distribution on long focal point
27 optical lens
28 solid-state imaging apparatus
29 distributed index lens for a pixel in the center part
30 distributed index lens for a pixel in the periphery
31 incident light (center part)
32 incident light (periphery)
33 microlens
34 incident light (oblique incidence)
35 incident light (vertical incidence)
70 to 73, 80 solid-state imaging apparatus
101 high refractive index material ($TiO_2$)
102 low refractive index material (air)
103 width of adjacent divided areas 104 line widths of a zone (sum)
104a, 104b line width of a zone
200 distributed index lens for B light
201 distributed index lens for G light
202 distributed index lens for R light
200 line widths of a zone (sum)
150a to 150c line width of a zone
200 resist
201 $TiO_2$
202 mold
203 Ar ion milling
204 wet etching

BEST MODE FOR CARRYING OUT THE INVENTION

Hereafter, the embodiments of the present invention are described in specific with references to drawings.

FIRST EMBODIMENT

FIG. 4 is a cross-section diagram showing a fundamental structure of a unit pixel according to the first embodiment of the present invention. A solid-state imaging apparatus (unit pixel for blue light) 71, which is 2.25 µm per side in size, includes a distributed index lens (also called as "a group of light transmitting films") 1, and collects incident light 9, a color filter 2 which separates the blue light (B) from the incident light and passes the blue light, a light-receiving device (Si photodiodes) 6 which converts the incident light into charge, an electric signal transmitting unit 4 for transmitting the charge, Al wirings 3, planarized layers 5, and a Si substrate 7. It should be noted that the distributed index lens 1 has a predetermined thickness t (e.g. 1 µm).

FIG. 5 is a diagram showing a structure of a top surface of the distributed index lens according to the first embodiment of the present invention. The group 1 of the light-transmitting films having a concentric zone model is composed of a high refractive index light-transmitting material 101 (e.g. $TiO_2$ (n=2.53)) and low refractive index light-transmitting material 102 (e.g. air (n=1.0)). The width 103 of multiple adjacent divided areas is, for example, a constant 200 nm. The concentric high refractive index light-transmitting material 101 and the concentric low refractive index light-transmitting material 102 respectively form a zone. Accordingly, the distributed index lens 1 is also a group of the multiple zones. It should be noted that the width of a zone is called "line width".

Here, the "divided area" is an area concentrically divided with an arbitral width as long as a wavelength of the incident light or shorter than the wavelength.

In FIG. 5, the high refractive index light-transmitting material in each divided area (i.e. an area divided by dashed lines) of the distributed index lens 1 is one. The outer boundary of the zone of each high refractive index light-transmitting material is equivalent to the outer boundary of each divided area.

Note that, in FIG. 5, the low refractive index light-transmitting material 102 is air so that it fills spaces between the high refractive index light-transmitting materials. Also, the low refractive index light-transmitting material can be a vacuum in which a refractive index is equal to that of the air.

Figure 6B:
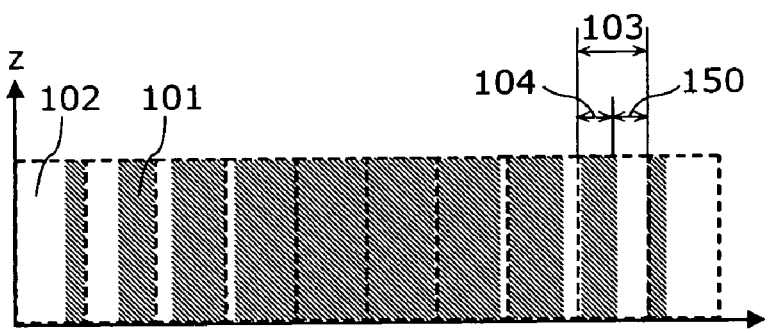

FIGS. 6A to 6D are diagrams showing a cross-sectional structure of the distributed index lens according to the first embodiment of the present invention. In FIG. 6A, a high refractive index light-transmitting material in each divided area of the distributed index lens 1 is one, and FIG. 6A shows a state where the high refractive index light-transmitting materials are arranged in contact with the outer boundary of the divided area. In FIG. 6B, the high refractive index light-transmitting material for each divided area of the distributed index lens 1 is one, and FIG. 6B shows a state where the high refractive index light-transmitting materials are arranged in contact with the inner boundary of the divided area (i.e. the low refractive index light-transmitting materials are arranged in order to contact with the outer boundary of the divided area).

Figure 6C:
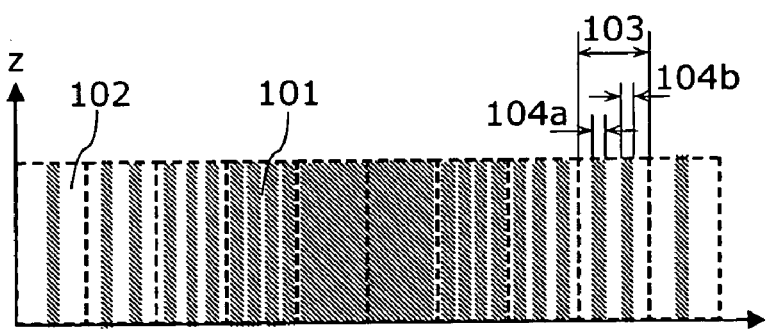
Figure 6D:
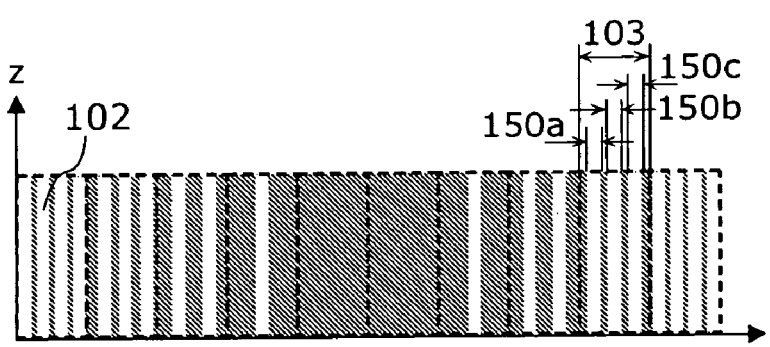
Figure 6E:
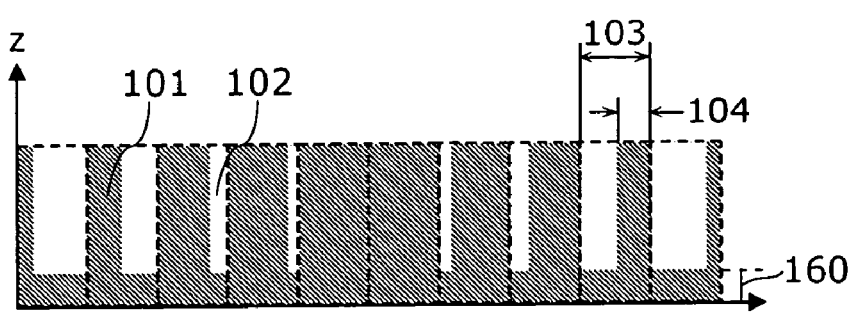

Here, in each divided area, the number of light-transmitting films (i.e. zones) can be plural (FIGS. 6C and 6D). Herein, the line width of the high refractive index light-transmitting material can be constant (FIG. 6C). Also, it is obvious that the line width of the low refractive index light-transmitting material may be stable (FIG. 6D). That is, as shown in FIG. 6E, in a divided area, the high refractive index light-transmitting material can be formed in a shape of "L-type" (i.e. the low refractive index light-transmitting material is not penetrated), and the low refractive index light-transmitting material can be formed in the remaining area. In this case, as shown in FIGS. 6A and 6E, if the volume ratio of the high refractive index light-transmitting materials in one divided area is the same, it can be said that the high refractive index light-transmitting materials have an equivalent refractive index.

In FIGS. 6A to 6D, in any one of the distributed index lens, the total line width 104 of zones in each divided area is the longest in the center part as it is decreasing toward the external part of the divided area. In other words, the total line width of a zone in an external divided area is smaller than a total line width of a zone in an internal divided area (area toward the center zone).

Also, in the distributed index lens 1, the total width 104 in a divided area is same as the total width in a corresponding divided area. In other words, the total of line width 104a and line width 104b in FIG. 6C is equivalent to the length of line width 104 in FIG. 6A or in FIG. 6B. Similarly, the total of line width 150a, line width 150b and line width 150c in FIG. 6D is equivalent to the length of line width 150 in FIG. 6B. It should be noted that the film thickness t is constant in 1 µm in any of the distributed index lens shown in FIGS. 6A to 6D.

When the width of the divided area is equivalent to or smaller than the wavelength of incident light, an effective refractive index $n_{eff}$ which the light senses can be indicated as follows.

$$n_{eff} = \{W \times nh + (a-W)nl\}/a \quad (1)$$

Here, W indicates a line width of a high refractive index light-transmitting material (including a total line width) within a divided area, a indicates a width of each divided area, nh and nl respectively indicate the refractive indexes of the high refractive index light-transmitting material and the low refractive index light-transmitting material.

Figure 7:
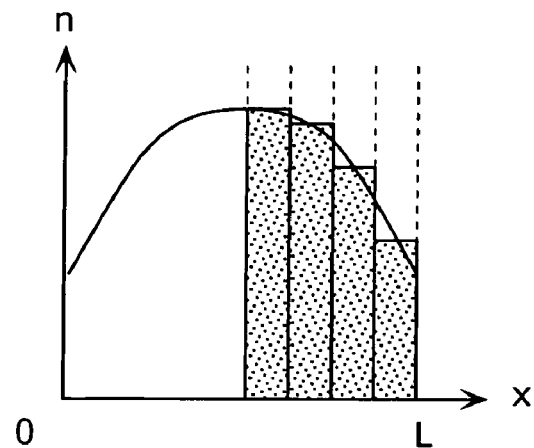
FIG. 7 is a diagram showing a refractive index distribution of the distributed index lens according to the first embodiment of the present invention.

FIG. 7 is a diagram showing a distribution of refractive indexes of the distributed index lens according to the first embodiment of the present invention. The refractive index of the distributed index lens has the highest value in the center part and its value decrease toward the edge. That is, it has a step-like characteristic. It should be noted that a parabola shown in FIG. 7 indicates a distribution of refractive indexes for collecting incident light in a focal length f (4.43 µm) with the wavelength λ (500 nm). It is indicated in the following equation (e.g. Hiroshi Nishihara, et al., *Optical Integrated Circuits*, Ohmsha, August, 1993, p. 299).

$$\Delta n(r) = \Delta n_{max}[1 + m - n_1 r^2/(2\lambda f)] \quad (2)$$

Here, λ indicates a wavelength of the incident light, f indicates a focal length, $n_0$ indicates a refractive index of the light incoming side material (light incoming side medium), $n_1$ indicates a refractive index of light outgoing side material (light outgoing side medium), m indicates non-negative integer, $n_0+\Delta n_{max}$ indicates the maximum value of the refractive index of the light-transmitting film (in this case, $\Delta n_{max}$ is 1.53), and $\Delta n(r)$ is a difference of the refractive index subtracted from the $n_0$ at the position r.

From the equations (1) and (2), a line width W of the light-transmitting film having a radius r of the outer boundary of the light-transmitting film which is in a circular zone model satisfies the following equation.

$$W=a(1+m-n_1 r^2/(2\lambda f)) \quad (3)$$

However, m=0, 1, 2, . . . , $$r_m < |r| < r_{m+1},$$

and Fresnel zone boundary rm>0 satisfies the following equation.

$$r_m^2 = 2m\lambda f/n,$$

It should be noted that the distribution of the refractive indexes of the distributed index lens according to the present invention is designed to take a value of a center of parabola in each divided area.

As is clear from the equation (3), the significant characteristic of the light-collecting device according to the present invention is that a phase of the incident light can be modulated only by changing the line width W and the focal point can be freely determined so that a distributed index lens corresponding to the light of particular wavelength can be realized.

For example, in the embodiment shown in FIG. 4, the light-collection ratio of the distributed index lens is about 97 percent which realizes higher light-collection efficiency than the microlens that has the light-collection ratio of 90 percent.

Accordingly, a distributed index type light-collecting device which can change the effective refractive index by changing the total of line widths of the light-transmitting materials which made of a group of light-transmitting films can be realized.

SECOND EMBODIMENT

Figure 8A:
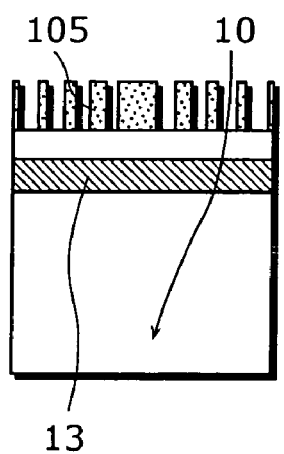
FIGS. 8A to 8C are diagrams, each of which shows a fundamental structure of a unit pixel according to the second embodiment of the present invention.
Figure 8B:
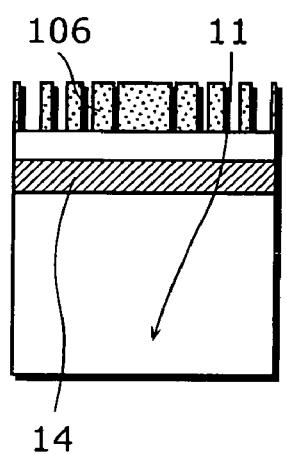
Figure 8C:
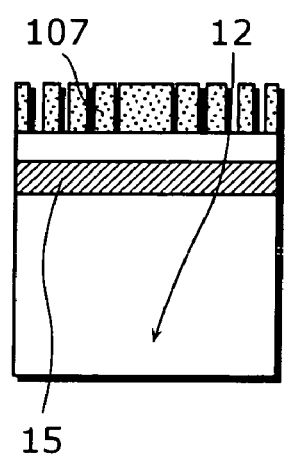

FIGS. 8A to 8C are diagrams showing a fundamental structure of a unit pixel according to the second embodiment of the present invention. The respective B light 10, G light 11, and R light 12 that is incident vertically into respective pixels of a solid-state imaging apparatus are collected respectively in a refractive index lens 105 for B, a refractive index lens 106 for G and a refractive index lens 107 for R, and converted into an electric signal at each light-receiving device respectively through a color filter 13 for B, a color filter 14 for G and a color filter 15 for R. The distributed index lenses 105 to 107 according to the present invention can optimize a lens structure of each unit pixel according to a wavelength of the incident light 10 to 12. Therefore, the light-collection efficiency for different colors becomes the same and the light can be collected highly efficiently. In other words, whereas the distributed index lens 105 for B has a greater reduction ratio of (total of) line widths of the high refractive index light-transmitting material in each concentric divided area (i.e. the line width of the light-transmitting film becomes thinner suddenly toward the outer boundary), the reduction ratio of the line width becomes moderate toward the distributed index lens 106 for G and the distributed index lens 107 for R (i.e. the line width does not become thinner suddenly at the light-transmitting film at the outer boundary). As shown in the equation (2), this is because that the refractive index distribution is inversely proportional to the wavelength $\lambda$ of the incident light.

Figure 9A:
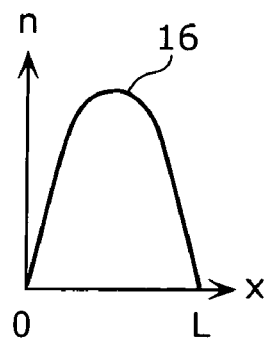
FIGS. 9A to 9C are diagrams, each of which shows a refractive index distribution of a distributed index lens according to the second embodiment of the present invention.
Figure 9B:
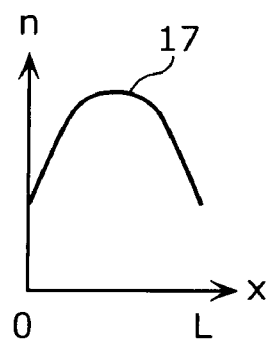
Figure 9C:
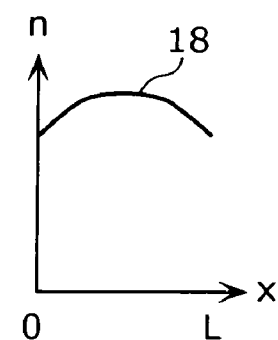

FIGS. 9A to 9C are diagrams showing distributions of the distributed index lens according to the second embodiment of the present invention. That is, determining the refractive index change 17 for green light shown in FIG. 9B as the center, the refractive index change 16 is bigger as the wavelength is shorter (blue side) as shown in FIG. 9A and broader as the wavelength is longer (red side) as shown in FIG. 9C.

Accordingly, the focal length of incident light having a certain wavelength can be controlled only by the line width of the light-transmitting material which made of a group of the light-transmitting films so that the distributed index lens according to the present invention can be formed using a semiconductor lithography process.

THIRD EMBODIMENT

Figure 10:
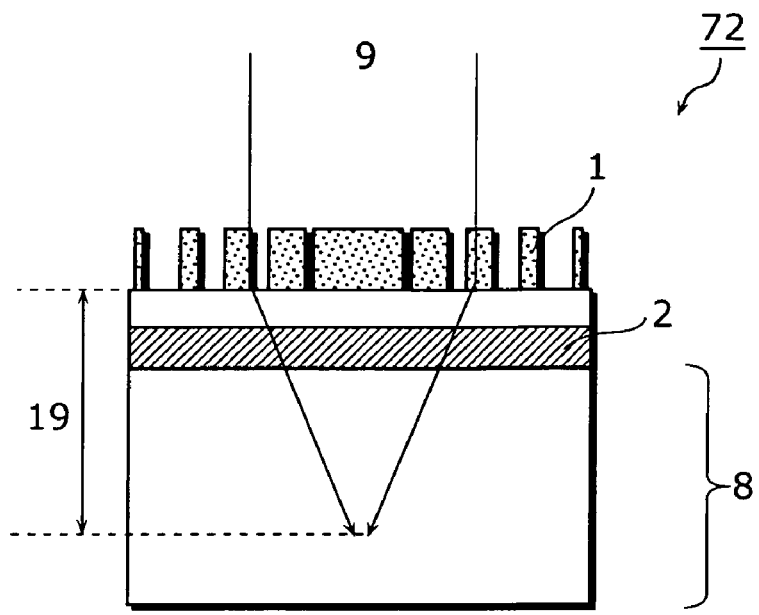
FIG. 10 is a diagram showing a fundamental structure of a unit pixel according to the second embodiment of the present invention.

FIG. 10 is a diagram showing a fundamental structure of a unit pixel according to the third embodiment of the present invention. The incident light 9 which is incident vertically into the solid-state imaging apparatus 72 is collected by the distributed index lens 1 and reaches a light-receiving device (not shown in the diagram) through the color filter 2. Herein, as described in the above, a focal length 19 of the incident light 9 can be changed according to the structure of the lens that is a light-collecting device of each unit pixel.

Figure 11A:
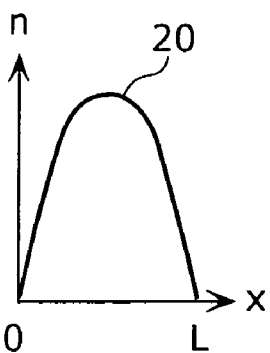
FIGS. 11A to 11C are diagrams, each of which shows a refractive index distribution of a distributed index lens according to the third embodiment of the present invention.
Figure 11B:
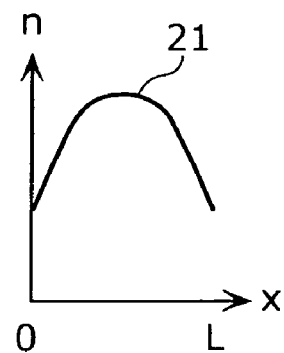
Figure 11C:
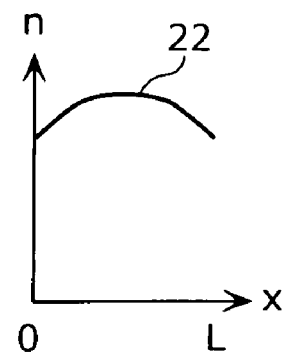

FIGS. 11A to 11C are diagrams, each of which shows a refractive index distribution of the distributed index lens according to the third embodiment of the present invention. With reference to a refractive index variation 21 of a middle focal length lens shown in FIG. 11B, a short focal length lens shown in FIG. 11A has a larger refractive index variation 20 while a long focal length lens shown in FIG. 11C has a moderate distribution 22. In the unit pixel according to the present embodiment, a structure of each distributed index lens is designed by reflecting the characteristics.

FIGS. 12A to 12C are diagrams, each of which shows a light collectivity of the distributed index lens according to the third embodiment of the present invention. In each of FIG. 12A to 12C, a simulation result of light propagation profile in each pixel unit when the focal length is changed in a range of 2.66 to 4.47 μm is shown. As the set focal length becomes longer in order of FIG. 12A, 12B, and 12C, it can be seen that the convergence position of a luminous flux (indicated as an arrow on the right side of each diagram) is shifting to the light-receiving device side (i.e. the upper side of each diagram). This indicates that the focal length can be controlled by changing the lens structure of the light-collecting device in accordance with the equation (2).

In order to achieve high-resolution solid-state imaging apparatus, a high density pixel is necessary. However, an area of the Al wiring hardly changes whereas an area of a photodiode that is a light-receiving device becomes smaller as the pixel size is reduced. Therefore, a light-blocking area by the wired part on the light incoming side is increased (i.e. the entrance is narrowed) and the light-collection efficiency is lowered. For example, when the pixel size is 2.25 μm and an aperture ratio is about 24 percent, the amount of light reaches the light-receiving device 6 increases by setting the focal length at the aperture of the wirings 3 so that the light-collection efficiency is remarkably improved. For example, in the example, the light-collection efficiency reaches at 90 percent.

Accordingly, in the light-collecting device according to the present invention, the focal length of the incident light can be changed according to the structure so that the lens can be designed so as to be appropriate for the structure of each pixel unit.

FOURTH EMBODIMENT

Figure 13:
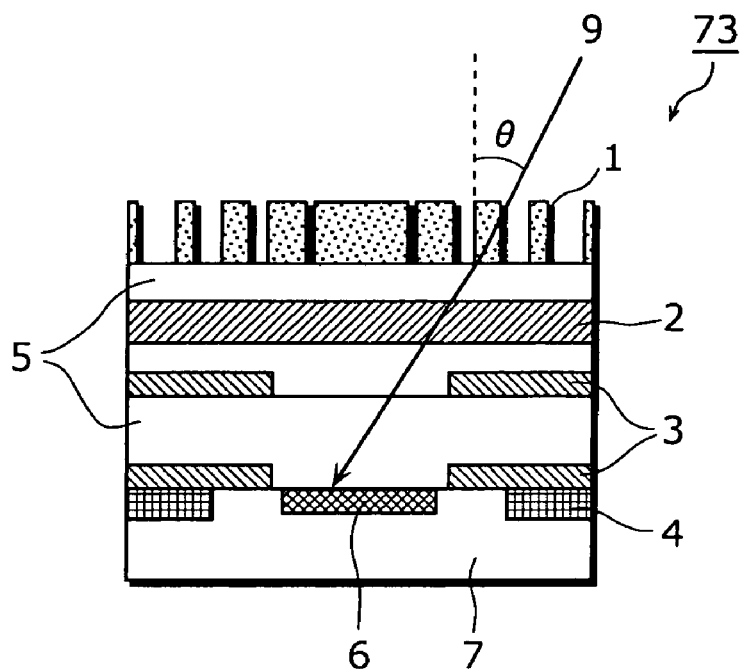
FIG. 13 is a diagram showing a fundamental structure of a unit pixel according to the fourth embodiment of the present invention.

FIG. 13 is a diagram showing a fundamental structure of a unit pixel according to the fourth embodiment of the present invention. The incident light 9 which is incident on a solid-state imaging apparatus 73 at a specific angle θ is collected at the distributed index lens 1 and reaches the light-receiving device 6 through the color filter 2. It is possible to form a lens resistant to the incident light with high incident angle by changing a focal length, wavelength and film thickness that are parameters of the distributed index lens 1. For example, in the present embodiment, for G light (λ=550 nm) of the incident angle of 30°, the distributed index lens having the focal length of 2.9 μm and the lens length of 0.9 μm is formed. Herein, the light-collection efficiency is 50 percent that is about five times more than the light-collection efficiency of a microlens.

Figure 14:
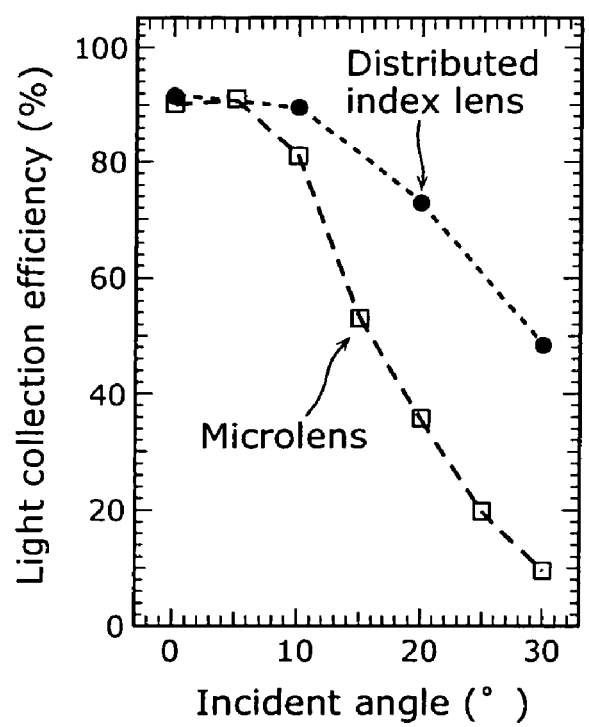
FIG. 14 is a diagram showing a light-collectivity of the distributed index lens according to the fourth embodiment of the present invention.

FIG. 14 is a diagram showing a light collectivity of a distributed index lens according to the fourth embodiment of the present invention. As is clear from FIG. 14, it can be said that the distributed index lens according to the present invention has a weaker dependency on the angle of the incident light compared to the conventional microlens. For example, while the microlens starts decreasing its light-collection efficiency when the incident angle is 5° or more, the distributed index lens maintains its light-collection efficiency at 90 percent until the incident angle is around 10°. Also, while the light-collection efficiency of the microlens is about 30 percent at the incident angle of 20°, the light-collection efficiency of the distributed index lens is 70 percent or more. Further, while the light-collection efficiency of the microlens is about 10 percent at the incident angle of 30°, the light-collection efficiency of the distributed index lens is maintained at 50 percent.

As described in the above, the solid-state imaging apparatus according to the present invention can restrain the reduction of light-collection efficiency along with an increase of the incident angle so that its application for a short focal length optical system such as camera for a cell phone can be expected.

Accordingly, in the light-collecting device according to the present invention, the lens structure of each unit pixel can be optimized according to the incident angle of the incident light so that the reduction of light-collection efficiency along with the increase of the incident angle can be restrained.

FIFTH EMBODIMENT

FIGS. 15A to 15C are diagrams showing a fundamental structure of a solid-state imaging apparatus according to the fifth embodiment of the present invention. The solid-state imaging apparatus uses the video graphics array (VGA) of 310,000 pixels. As shown in FIG. 15A, signal light 26 is collected at an optical lens 27 and irradiated on a solid-state imaging apparatus 28 having a distributed index lens. In the solid-state imaging apparatus 28 in which a semiconductor integrated circuit 8 including light-receiving devices, wirings and the like and distributed index lens are arranged in a two-dimensional array, the incident angle of light differs for unit pixels in a center part and for unit pixels in a peripheral part. While, as shown in FIG. 15B, the incident light 31 is incident at nearly 0° into the unit pixels in the center part, as shown in FIG. 15C, the incident light 32 is incident at the incident angle of about 30° into the unit pixels in the peripheral part.

Accordingly, in the present embodiment, four types of distributed index lenses are concentrically formed in stages from the center part towards the peripheral part of the solid-state imaging apparatus 28. Each distributed index lens optimizes the lens structure depending on the position of a unit pixel on the solid-state imaging apparatus 28 so that the light-collection efficiency becomes the highest. In other words, as shown in FIG. 15B, a distributed index lens 29 of a unit pixel positioned in the center part is a distributed index lens of a general structure, while a distributed index lens 30 of a pixel positioned in the peripheral part is set to have a larger refractive index variation by narrowing the line width than general in order to correspond to oblique incident light. Accordingly, even if the incident light has larger angle components, most of the components can reach the aperture so that the pixels positioned in the peripheral part can also achieve high light-collection efficiency.

It should be noted that in the present embodiment, the semiconductor integrated circuit is not shrunk. Also, there is no doubt that the distributed index lens can be optimized by defining two, three or more than five steps of regions rather than limited to four steps.

FIG. 16 is a diagram showing a light collectivity of a distributed index lens according to the fifth embodiment of the present invention. The increase of incident angle indicates that the unit pixel is positioned closer to the periphery of the solid-state imaging apparatus. As a comparison of the effect of the present invention, FIG. 16 shows a light-collection efficiency in the conventional microlens structure and data of the solid-state imaging apparatus which shrinks the semiconductor integrated circuit. As is clear from FIG. 16, in spite of the fact that the solid-state imaging apparatus having the distributed index lens according to the present invention is not shrunk, it achieves for example a light-collection efficiency of about 50 percent even at the incident angle is 30° that is as much as the light-collection efficiency of the solid-state imaging apparatus that is shrunk. Further, within the incident angle of 10°, it is succeeded to obtain the light-collection efficiency that is more than that of the solid-state imaging apparatus that is shrunk. For example, in the case where the incident angle is 20°, while the light-collection efficiency of the shrunk solid-state imaging apparatus is about 80 percent, the solid-state imaging apparatus having the distributed index lens according to the present invention achieves the light-collection efficiency of about 90 percent. It indicates that shrink-free solid-state imaging apparatus can be manufactured.

Further, it is expected that a solid-state imaging apparatus with high sensitivity whose light-collection efficiency does not depend on a pixel position can be realized. Therefore, usability of the solid-state imaging apparatus having the distributed index lens according to the present invention is very high.

SIXTH EMBODIMENT

FIGS. 17A to 17D are diagrams showing methods of manufacturing the solid-state imaging apparatus according to the first to fifth embodiments of the present invention. As in the following description, the distributed index lens according to the present invention is formed by nanoimprinting and etching.

Figure 17A:
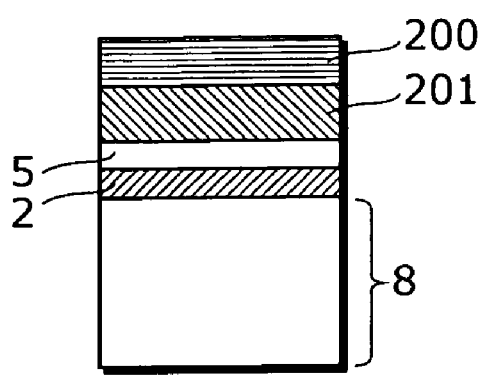
FIGS. 17A to 17D are diagrams showing a manufacturing method of solid-state imaging apparatuses according to the first to fifth embodiments of the present invention.

As shown in FIG. 17A, first using an ordinary semiconductor process, the following are sequentially formed on a Si substrate: a semiconductor integrated circuit 8 including a light-receiving device, wirings, a light-blocking layer, a signal transmitting unit and the like (omitted in FIG. 17), a color filter 2 and a planarized layer 5. Here, the size of one pixel is 2.25 µm square and the size of the light receiving device is 1.1 µm square.

After that, a TiO$_2$ film 201 is formed on top of the planarized layer 5 using a plasma CVD, and resist 200 is coated on the planarized layer 5. Here, the thicknesses of the TiO film 201 and the resist 200 are respectively 0.8 µm and 1 µm.

Figure 17B:
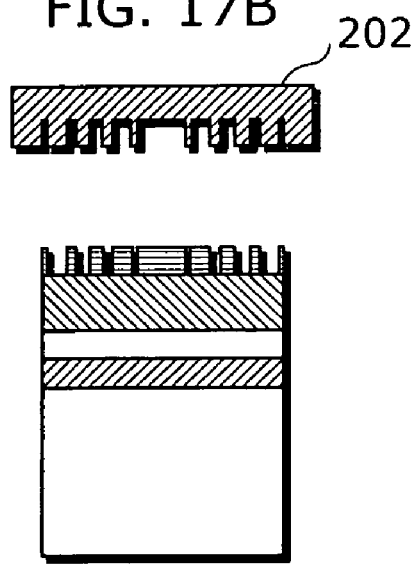

Next, as shown in FIG. 17B, a SiN made mold 202 which is made by patterning a concentric structure is hot-pressed to the resist 200 at 150° C. so as to transfer a fine structure on the resist 200. It should be noted that the mold is formed by general electron beam lithography and etching.

Figure 17C:
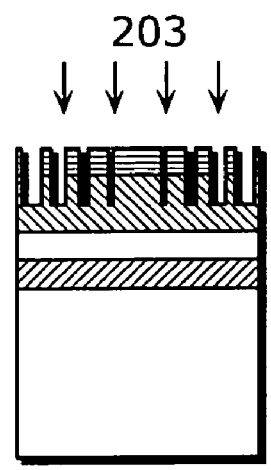
Figure 17D:
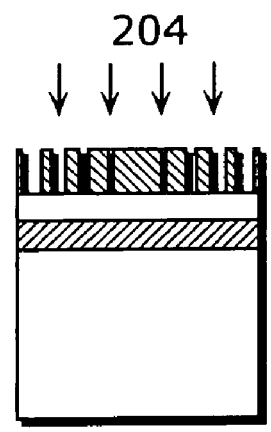

Following that, as shown in FIG. 17C, after post-baking it at 180° C., the first etching 203 is performed on the post-baked by Ar ion milling. Then, as shown in FIG. 17D, after removing the resist 200, a distributed index lens having a concentric structure is formed on a pixel by wet etching 204. Through the mentioned processing, the solid-state imaging apparatus according to the present invention can be manufactured.

Thus, by the manufacturing method of the light-collecting device according to the present invention, a fine concentric structure can be easily manufactured in large quantity. Also, the light-collecting device can be lower-priced because displacement of relative position between pixels is not generated so that adjustment works are reduced. Further, the distributed index lens has a constant lens thickness so that the manufacturing process can be easily performed and the manufacturing costs can be reduced. Furthermore, the distributed index lens has a rectangular cross-section in the direction of the normal line.

The described lens according to the second to fifth embodiments is formed by a nanoprinting method using a mold whose minimum dimension is 1 nm or less, and is a distributed index lens using a difference of refractive indexes between TiO$_2$ and air.

Also, it is desirable to use a high refractive transparent material whose refractive index is from 1.45 to 3.4 inclusive. Further, it is desirable for the light-transmitting film to use one of TiO$_2$ (refractive index 2.3 to 2.55), ZrO$_2$ (2.05), Nb$_2$O$_5$ (2.2), Ta$_2$O$_5$ (2.1), Si$_3$N$_4$ (2.0) and Si$_2$N$_3$. Theses are the high refractive index materials so that the thickness of the light-transmitting film can be thinned and the manufacturing process can be easier.

Further, it is desirable to use one of SiO$_2$ doped with B or P (Boro-Phospho Silicated Glass (BPSG)) and Teraethoxy Silane (TEOS). Since they are the generally used materials in the conventional semiconductor process so that the light-collecting device can be formed easily and the costs of manufacturing can be reduced.

Furthermore, it is desirable for the light-transmitting film to use one of benzocyclobutene (1.5), polymethymethacrylate (1.55), polyamide (1.53), and polyimide (1.58). The resin can be directly processed so that the light-collecting device can be directly formed by nanoimprinting. Therefore, the mass production is increased.

Note that, while the CCD is used in the first to fifth embodiments, a MOS sensor can be also used. Also, a distributed index lens made of other materials, which has a same characteristic as the distributed index lens described in the above, can be used. Further, a distributed index lens can be manufactured using a manufacturing method other than the aforementioned method. Furthermore, a material other than air can be used for the low refractive index material.

In addition, the form of the light-transmitting film may be a concentric form such as polygon and ellipse other than a circle. Also, a sensor in which a lens according to the present invention is equipped may have a shrink structure.

INDUSTRIAL APPLICABILITY

A light-collecting device and a solid-state imaging apparatus according to the present invention can be used as a digital video camera, a digital still came, a camera equipped cell phone and the like, and it is realized to be improved its capability and in lower price. Therefore, it has an industrial usability.

The invention claimed is:

1. A solid-state imaging apparatus comprising pixels that are arranged in a two-dimensional array, each of said pixels including a light-collector and a light-receiver,
   wherein said light-collector includes:
      a substrate onto which incident light is incident;
      above said substrate, a plurality of light-transmitting films formed in a region onto which the incident light is incident; and
      said plurality of light-transmitting films forming a plurality of zones each of which has a width equal to or shorter than a wavelength of the incident light, and forming an effective refractive index distribution,
   wherein, for each of said pixels located in a center of an imaging area, a central axis of said light-receiver matches a central axis of said light collector, the imaging area being a plane on which said pixels are formed,
   wherein, for each of said pixels located in a periphery of the imaging area, the central axis of said light-collector is displaced from the central axis of said light-receiver toward the center of the imaging area,
   wherein each of said plurality of light-transmitting films included in one of said pixels located in the center of the imaging area corresponds to a relative one of said plurality of light-transmitting films which is in a same relative position in one of said pixels located in the periphery of the imaging area,
   wherein each of said plurality of light-transmitting films included in the one of said pixels located in the center of the imaging area has a line width different than a line width of the corresponding relative one of said plurality of light-transmitting films included in the one of said pixels located in the periphery of the imaging area, and
   wherein a sum of the line widths of said light-transmitting films included in the one of said pixels located in the center of the imaging area differs from a sum of the line widths of said light-transmitting films included in the one of said pixels located in the periphery of the imaging area.

2. The solid-state imaging apparatus according to claim 1, comprising at least:
   a first pixel for first color light out of the incident light; and
   a second pixel for second color light which has a typical wavelength that is different from a typical wavelength of the first color light,
   wherein said first pixel includes a first light-collector, and said second pixel includes a second light-collector in which a focal length of the second color light is equal to a focal length of the first color light in said first light-collector.

3. The solid-state imaging apparatus according to claim 1,
   wherein the imaging area is divided by concentric areas from the center of the imaging area to the periphery of the imaging area, focal lengths of said light-collectors of said pixels belonging to a same one of the areas are equal, and focal lengths of said light-collectors of said pixels belonging to different ones of the areas are different.

4. The solid-state imaging apparatus according to claim 1, wherein the line width of each of said plurality of light-transmitting films included in the one of said pixels located in the center of the imaging area is greater than the line width of the corresponding relative one of said plurality of light-transmitting films included in the one of said pixels located in the periphery of the imaging area.

5. A solid-state imaging apparatus comprising pixels that are arranged in a two-dimensional array, each of said pixels including a light-collector and a light-receiver, wherein said light-collector includes:

a substrate onto which incident light is incident;

above said substrate, a plurality of light-transmitting films formed in a region onto which the incident light is incident; and said plurality of light-transmitting films forming a plurality of zones each of which has a width equal to or shorter than a wavelength of the incident light, and forming an effective refractive index distribution, wherein each of said pixels further includes:

a wiring layer that has an aperture above said light-receiver on a light-outgoing side plane area of said light-collector; and a focal point of light collected by said light-collector that matches a central axis of the aperture of said wiring layer, wherein, for each of said pixels located in a center of an imaging area, a central axis of said light-receiver matches a central axis of said light-collector, the imaging area being a plane on which said pixels are formed, wherein, for each of said pixels located in a periphery of the imaging area, the central axis of said light-collector is displaced from the central axis of said light-receiver toward the center of the imaging area, wherein each of said plurality of light-transmitting films included in one of said pixels located in the center of the imaging area corresponds to a relative one of said plurality of light-transmitting films which is in a same relative position in one of said pixels located in the periphery of the imaging area, wherein each of said plurality of light-transmitting films included in the one of said pixels located in the center of the imaging area has a line width different than a line width of the corresponding relative one of said plurality of light-transmitting films included in the one of said pixels located in the periphery of the imaging area, and wherein a sum of the line widths of said light-transmitting films included in the one of said pixels located in the center of the imaging area differs from a sum of the line widths of said light-transmitting films included in the one of said pixels located in the periphery of the imaging area.

* * * * *